United States Patent [19]
Mak et al.

[11] Patent Number: 6,099,904
[45] Date of Patent: Aug. 8, 2000

[54] LOW RESISTIVITY W USING $B_2H_6$ NUCLEATION STEP

[75] Inventors: Alfred Mak, Union City; Kevin Lai, Santa Clara; Cissy Leung, Fremont, all of Calif.; Dennis Sauvage, Meylan, France

[73] Assignee: Applied Materials, Inc., Santa Clara, Calif.

[21] Appl. No.: 08/982,844

[22] Filed: Dec. 2, 1997

[51] Int. Cl.[7] .................................................. C23C 16/08
[52] U.S. Cl. ................ 427/253; 427/255.23; 427/255.7; 438/656; 438/680; 438/685
[58] Field of Search .................................... 427/250, 253, 427/255.1, 255.7, 255.23; 438/656, 680, 685

[56] References Cited

U.S. PATENT DOCUMENTS

| | | | |
|---|---|---|---|
| 4,699,805 | 10/1987 | Seelbach et al. | 437/245 |
| 4,957,666 | 9/1990 | Black et al. | 427/53.1 |
| 5,028,565 | 7/1991 | Chang et al. | 437/192 |
| 5,043,299 | 8/1991 | Chang et al. | 437/192 |
| 5,250,467 | 10/1993 | Somekh et al. | 437/192 |
| 5,272,112 | 12/1993 | Schmitz et al. | 438/672 |
| 5,306,666 | 4/1994 | Izumi | 437/192 |
| 5,328,722 | 7/1994 | Ghanayem et al. | 427/250 |
| 5,407,698 | 4/1995 | Emesh | 427/99 |
| 5,433,975 | 7/1995 | Roberts et al. | 427/253 |
| 5,769,951 | 6/1998 | Van De Ven et al. | 118/725 |

FOREIGN PATENT DOCUMENTS

| | | |
|---|---|---|
| 4-74865 | 3/1992 | Japan . |
| 8-264530 | 10/1996 | Japan . |

OTHER PUBLICATIONS

Takayuki Ohba, "Advanced Multilevel Metallization Technology", Applied Surface Science, pp. 1–11 (no month), 1995.

Takayuki Ohba et al., "Selective CVD Tungsten Silicide for VLSI Applications," International Electron Devices Meeting, Washington, DC, Dec. 6–9, 1987, pp. 213–216, Dec. 1987.

Takayuki Ohba, "Advanced Multilevel Metallization Technology," Applied Surface Science, pp. 1–11, (1995) (No Month).

T. Hara et al., "Low Resistivity Tungsten Film Using Diborane Reduction," Conference Proceedings ULSI–1X–1994 Materials Research Society—San Diego, CA Oct. 5–7, 1993, pp. 353–358, Oct. 1993.

Takayuki Ohba et al., "Chemical Vapour Deposition of Tungsten by the Reduction of $WF_6$ Using Si, $SiH_4$, $Si_2H_6$, $Si_3H_8$, $B_2H_6$, $PH_3$, and $H_2$," J. Instn. Electronics and Telecom. Engrs., vol. 37, No. 2, pp. 212–219, (1991) (No Month).

Primary Examiner—Timothy Meeks
Attorney, Agent, or Firm—Townsend and Townsend and Crew

[57] ABSTRACT

A multiple step chemical vapor deposition process for depositing a tungsten film on a substrate. A first step of the deposition process includes a nucleation step in which a process gas including a tungsten-containing source, a group III or V hydride and a reduction agent are flowed into a deposition zone of a substrate processing chamber while the deposition zone is maintained at or below a first pressure level. During this first deposition stage, other process variables are maintained at conditions suitable to deposit a first layer of the tungsten film over the substrate. Next, during a second deposition stage after the first stage, the flow of the group III or V hydride into the deposition zone is stopped, and afterwards, the pressure in the deposition zone is increased to a second pressure above the first pressure level and other process parameters are maintained at conditions suitable for depositing a second layer of the tungsten film on the substrate. In a preferred embodiment, the flow of the tungsten-containing source is stopped along with the flow of the group III or V hydride and after a period of between 5 and 30 seconds, the flow of the tungsten-containing source is restarted when the pressure is in the deposition zone is increased to the second pressure level.

33 Claims, 5 Drawing Sheets

LOW RESISTIVITY W USING $B_2H_6$ NUCLEATION STEP

CROSS-REFERENCE TO RELATED APPLICATIONS

This application is related to U.S. Ser. No. 08/857,658, entitled "LOW RESISTIVITY W USING $B_2H_6$," filed May 16, 1997, and having Ravi Rajagopalan, Steve Ghanayem, Manabu Yamazaki, Keiichi Ohtsuka and Yuji Maeda as co-inventors. The Ser. No. 08/857,658 application is assigned to Applied Materials, Inc. the assignee of the present application and is hereby incorporated by reference in its entirety.

BACKGROUND OF THE INVENTION

The present invention relates to the fabrication of integrated circuits. More particularly, the invention provides a technique, including a method and apparatus, for forming improved tungsten (W) films having decreased resistivity and strong adhesion.

Deposition of tungsten over a semiconductor substrate is a common step in the formation of some integrated circuit (IC) structures. For example, tungsten is commonly used to provide electrical contact to portions of a semiconductor substrate. These electrical contacts are usually provided through openings in an insulation layer, such as a silicon oxide layer, formed over the substrate. One method used to form such contacts includes the chemical vapor deposition (CVD) of tungsten to fill the opening after an initial layer of titanium nitride has been deposited in the opening. As another example, tungsten is sometimes used to form metal lines over a semiconductor substrate.

One CVD technique that has been employed to deposit tungsten films in the semiconductor industry uses tungsten hexafluoride ($WF_6$) and a hydrogen reducing agent, e.g., $H_2$, as precursor gases. One known process that uses this deposition technique includes two main steps: nucleation and bulk deposition. The nucleation step grows a thin layer of tungsten which acts as a growth site for subsequent film. In addition to $WF_6$ and $H_2$, the process gas used in the nucleation step of this technique includes silane ($SiH_4$), and may also include nitrogen ($N_2$) and argon. A bulk deposition step then is used to form the tungsten film. The bulk deposition gas is a mixture containing $WF_6$, $H_2$, $N_2$, and Ar.

As advances in integrated circuit technology lead to a scaling down of device dimensions and an increase in chip size and complexity, improved methods of depositing tungsten are continuously being sought. Research has been performed using diborane ($B_2H_6$) and other hydrides of Group III or V in place of or in addition to $H_2$ in the process gas for both the nucleation and bulk deposition stages of CVD tungsten deposition. Some of this research suggests that tungsten films deposited from a process gas that includes $B_2H_6$ exhibit reduced resistivity and increased deposition rates as compared to tungsten films deposited from a process gas without $B_2H_6$.

Despite this discovery, further improvements in the deposition of tungsten films are desirable.

SUMMARY OF THE INVENTION

The present invention provides a method and apparatus for forming an improved tungsten film. According to the method of the present invention, a multiple step chemical vapor deposition process for depositing the tungsten film over a substrate is taught. A first step of the multistep deposition process includes a nucleation step in which a process gas including a tungsten-containing source, a group III or V hydride and a reduction agent is flowed into a deposition zone of a substrate processing chamber while the deposition zone is maintained at or below a first pressure level. During this first deposition stage, other process variables are maintained at conditions suitable to deposit a first layer of the tungsten film over the substrate. Next, during a second deposition stage after the first stage, the flow of the group III or V hydride into the deposition zone is stopped, and afterwards, the pressure in the deposition zone is increased to a second pressure above the first pressure level and other process parameters are maintained at conditions suitable for depositing a second layer of the tungsten film on the substrate.

In a preferred embodiment, the flow of the tungsten-containing source is stopped along with the flow of the group III or V hydride, and the flow of the tungsten-containing source is restarted when the pressure is in the deposition zone is increased to the second pressure level. Preferable, the flow of the tungsten-containing source is stopped for a period of between 5 and 30 seconds.

In another embodiment, $N_2$ and a silane gas (e.g., $SiH_4$) are added to the process gas that includes a tungsten-containing source, $B_2H_6$ and a primary reduction agent during the nucleation stage. Preferably, the tungsten-containing source is $WF_6$ and the primary reduction agent is $H_2$. The flow of $N_2$, the primary reduction agent and a carrier gas are maintained throughout the nucleation stage until the completion of a bulk deposition stage. In an even more preferred embodiment, a deposition stage prior to the nucleation stage is employed in which a silane source is introduced into the deposition zone along with the primary reduction agent and a carrier gas but without $B_2H_6$ and without a tungsten-containing source. Optionally, an $N_2$ flow may also be introduced during this prior deposition stage.

These and other embodiments of the present invention, as well as its advantages and features are described in more detail in conjunction with the text below and attached figures.

DETAILED DESCRIPTION OF THE PREFERRED EMBODIMENTS

I. Introduction

The present invention allows for deposition of an improved tungsten film by flowing a hydride of an element of group III or V, such as $B_2H_6$, into the deposition chamber during the nucleation step and stopping the flow of the hydride before the bulk deposition of the tungsten layer. The present inventors discovered that tungsten films deposited in this manner have a combination of low resistivity and strong adhesion as compared to other tungsten films. Films deposited by the method of the present invention are suitable for use in the fabrication of integrated circuits having feature sizes of 0.35 microns or less. Also, the present invention can be used to deposit tungsten films in CVD chambers of conventional design.

II. Exemplary CVD Reactor Chamber

Figure 1A:
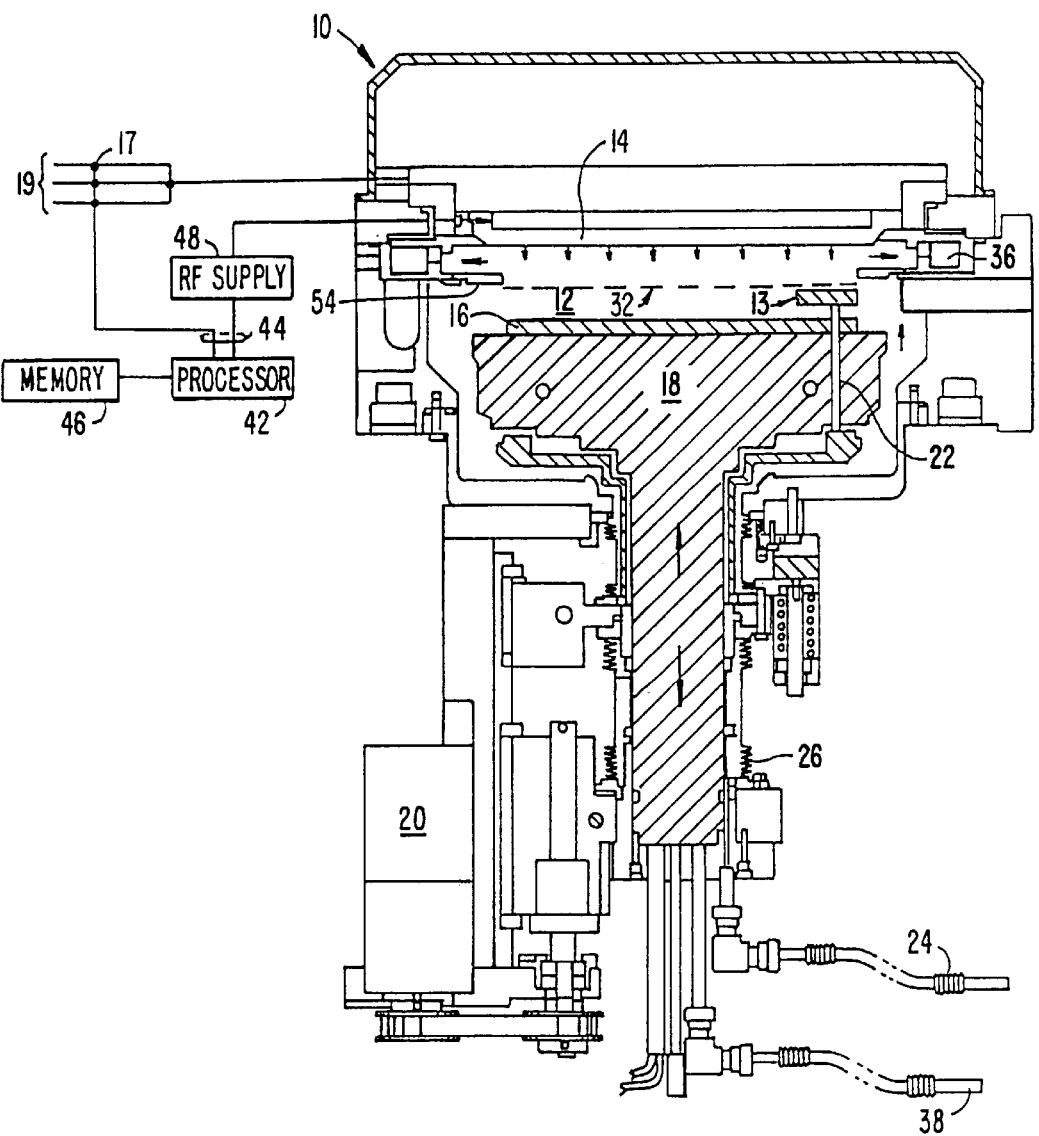
FIG. 1A is a vertical, cross-sectional view of one embodiment of a simplified chemical vapor deposition apparatus according to the present invention.
Figure 1B:
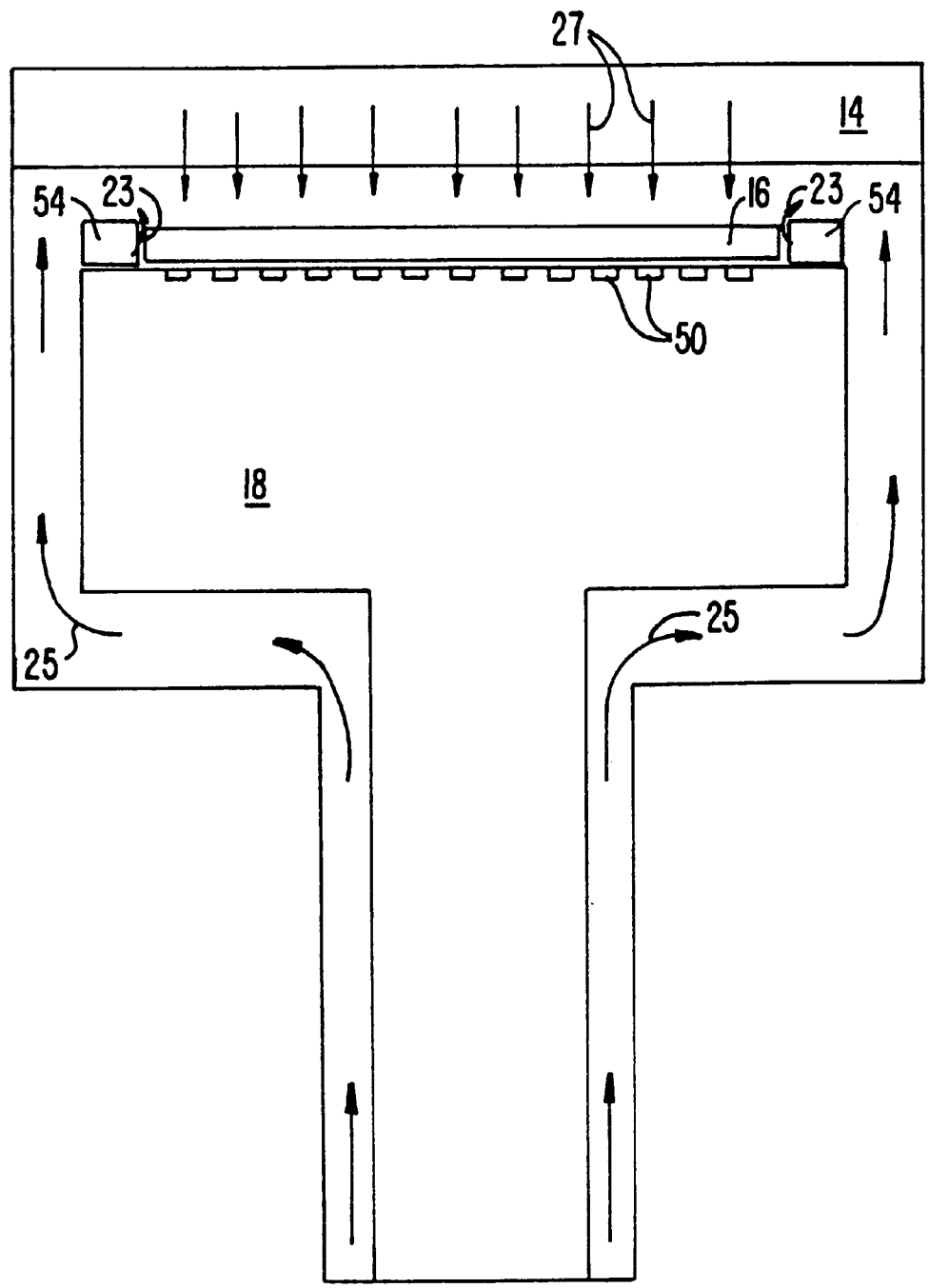
FIG. 1B is a vertical, cross-sectional view of one embodiment of a resistively heated susceptor used in the chamber of FIG. 1 to secure a substrate being processed in chamber.

FIGS. 1A and 1B illustrate one embodiment of a parallel plate, cold-wall chemical vapor deposition system 10 having a vacuum chamber 12 in which the tungsten film according to the present invention can be deposited. CVD System 10 contains a gas distribution manifold 14 for dispersing deposition gases to a wafer 16 that rests on a resistively-heated susceptor 18.

Chamber 12 may be part of a vacuum processing system having multiple processing chambers connected to a central transfer chamber and serviced by a robot. Substrate 16 is brought into chamber 12 by a robot blade through a slit valve in a sidewall of the chamber (not shown). Susceptor 18 is moveable vertically by means of a motor 20. Substrate 16 is brought into the chamber when susceptor 18 is in a first position 13 opposite the slit valve. At position 13, substrate 16 is supported initially by a set of pins 22 that pass through and are coupled to susceptor 18. Pins 22 are driven by a single motor assembly.

As the susceptor is brought to a processing position 32 opposite gas distribution manifold 14 as shown by the dotted line, pins 22 sink into susceptor 18 and substrate 16 is deposited onto the susceptor. Once positioned on susceptor 18, substrate 16 is affixed to the susceptor by a vacuum clamping system (shown in FIG. 1B as grooves 50).

As it moves upward toward processing position 32, substrate 16 contacts purge guide 54, which centers the substrate on the susceptor. Edge purge gases 23 are flowed through purge guide 54 across the edge of substrate 16 to prevent deposition gases from contacting the edge and backside of the substrate. Purge gases 25 are also flowed around heater/susceptor 18 to minimize deposition on an around the heater/susceptor. These purge gases are supplied from a purge line (FIG. 1A, 24) and are also employed to protect stainless steel bellows 26 from damage by corrosive gases introduced into the chamber during processing.

Deposition and carrier gases are supplied to a deposition zone of the chamber through gas lines 19 to manifold 14 in response to the control of valves 17. During processing, gas supplied to manifold 14 is distributed uniformly across the surface of the substrate as shown by arrows 27. Spent processing gases and by-product gases are exhausted from the chamber by means of exhaust system 36. The rate at which gases are released through exhaust system 36 into an exhaust line is controlled by a throttle valve (not shown). During deposition, a second purge gas through gas channels in the susceptor (not shown) and feed line 38 feeds purge gas against the edge of wafer 16 as previously described. An RF power supply 48 can be coupled to manifold 14 to provide for plasma-enhanced CVD (PECVD) cleaning of the chamber.

The throttle valve, gas supply valves 17, motor 20, resistive heater coupled to susceptor 18, RF power supply 48 and other aspects of CVD system 10 are controlled by a processor 42 over control lines 44 (only some of which are shown). Processor 42 operates under the control of a computer program stored in a computer-readable medium such as a memory 46. The computer program dictates the temperature, chamber pressure, timing, mixture of gases, RF power levels, susceptor position, and other parameters of a particular process.

In a preferred embodiment, the system controller includes a hard disk drive (memory 46 a floppy disk drive and a processor 42. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 42 controls all of the activities of the CVD machine. The system controller executes system control software, which is a computer program stored in a computer-readable medium such as a memory 46. Preferably, memory 46 is a hard disk drive, but memory 46 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 42.

Figure 1C:
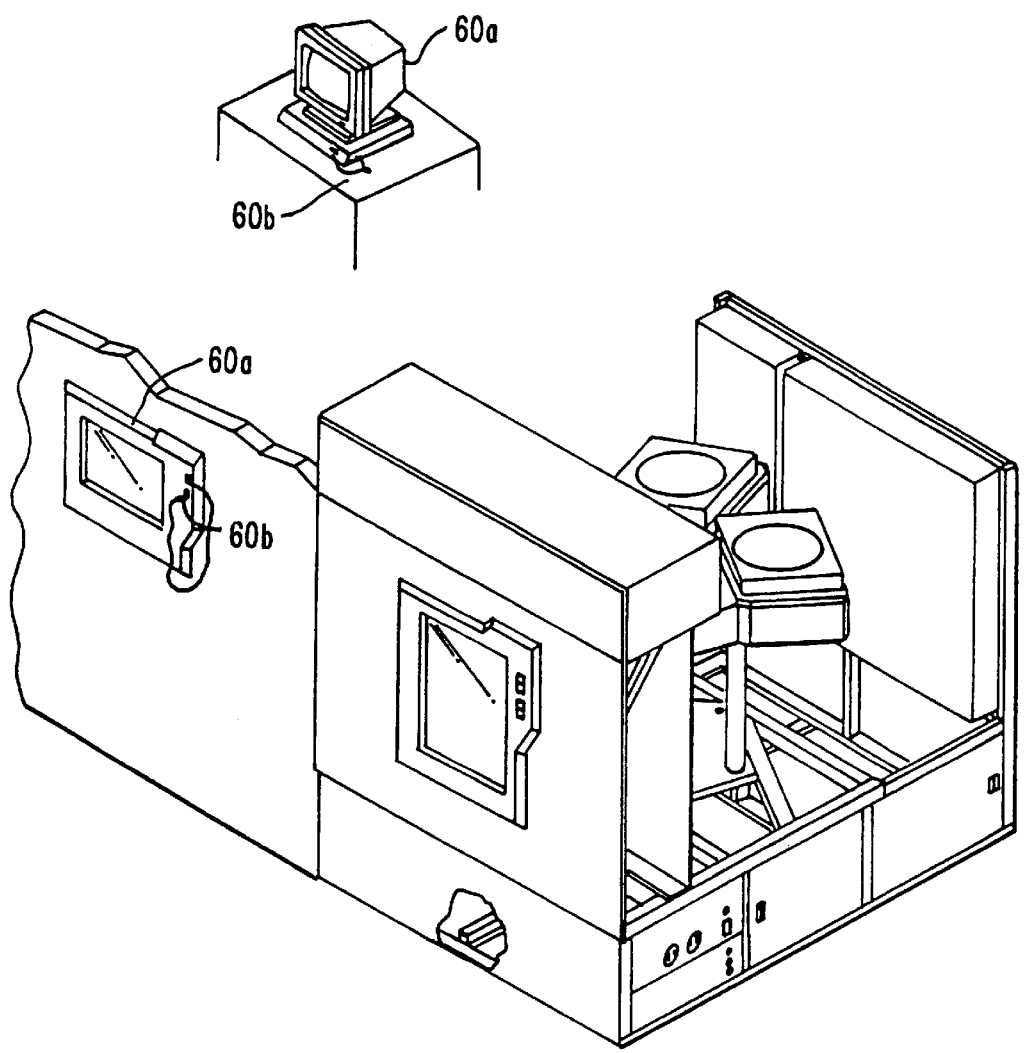
FIG. 1C is a simplified diagram of system monitor and CVD system 100 in a multi-chamber system, which may include one or more chambers.

The interface between a user and controller 42 is via a CRT monitor 60a and light pen 60b, shown in FIG. 1C which is a simplified diagram of the system monitor and CVD system 10 in a substrate processing system, which may include one or more chambers. In the preferred embodiment two monitors 60a are used, one mounted in the clean room wall for the operators and the other behind the wall for the service technicians. The monitors 60a simultaneously display the same information, but only one light pen 60b is enabled. A light sensor in the tip of light pen 60b detects light emitted by CRT display. To select a particular screen or function, the operator touches a designated area of the display screen and pushes the button on the pen 60b. The touched area changes its highlighted color, or a new menu or screen is displayed, confirming communication between the light pen and the display screen. Other devices, such as a keyboard, mouse, or other pointing or communication device, may be used instead of or in addition to light pen 60b to allow the user to communicate with controller 42.

The process for depositing the film can be implemented using a computer program product that is executed by controller 42. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 1D:
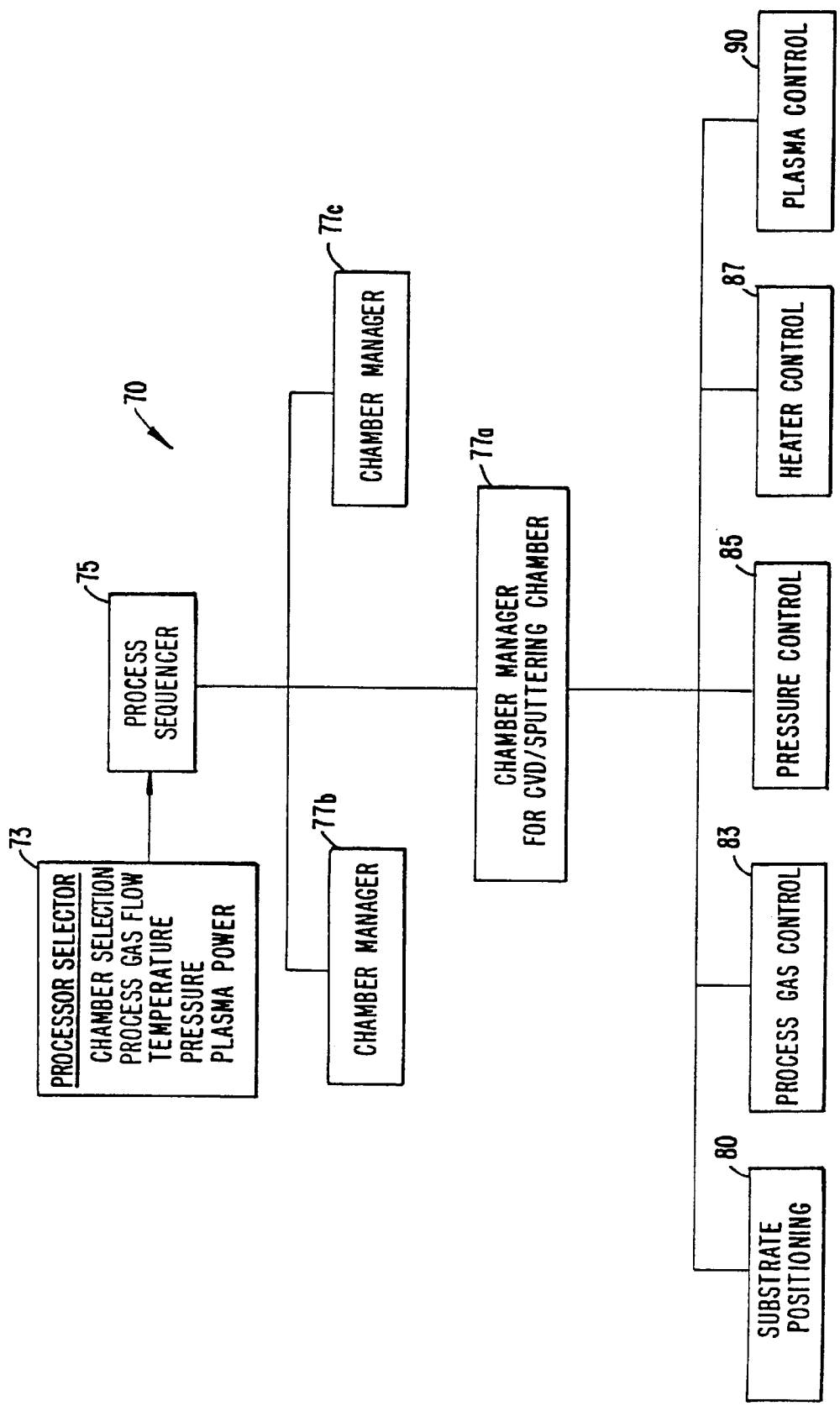
FIG. 1D shows an illustrative block diagram of the hierarchical control structure of the system control software, computer program 170, according to a specific embodiment.

FIG. 1D is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a–c, which controls multiple processing tasks in a process chamber 12 according to the process set determined by the sequencer subroutine 75. For example, the chamber manager subroutine 77a comprises program code for controlling sputtering and CVD process operations in the process chamber 12. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87 and plasma control subroutine 90 in some embodiments. A person having ordinary skill in the art will readily recognize that other chamber control subroutines can be included depending on what processes are to be performed in the process chamber 12. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 12 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1D. The substrate positioning subroutine 80 comprises program code for controlling chamber components that are used to load the substrate onto susceptor 18 and, optionally, to lift the substrate to a desired height in the chamber 12 to control the spacing between the substrate and the gas distribution manifold 14. When a substrate is loaded into the process chamber 12, susceptor 18 is lowered to receive the substrate, and thereafter, the susceptor 18 is raised to the desired height in the chamber, to maintain the substrate at a first distance or spacing from the gas distribution manifold during the CVD process. In operation, the substrate positioning subroutine 80 controls movement of susceptor 18 in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 12 to stabilize the pressure in the chamber before reactive process gases are introduced. For these processes, the process gas control subroutine 83 is programmed to include steps for flowing the inert gas into the chamber 12 for an amount of time necessary to stabilize the pressure in the chamber, and then the steps described above would be carried out.

The pressure control subroutine 85 comprises program code for controlling the pressure in the chamber 12 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 12 by reading one or more conventional pressure manometers connected to the chamber, to compare the measure value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 12 to the desired pressure.

The heater control subroutine 87 comprises program code for controlling the current to a heating unit that is used to heat the substrate 20. The heater control subroutine 87 is also invoked by the chamber manager subroutine 77a and receives a target, or set-point, temperature parameter. The heater control subroutine 87 measures the temperature by measuring voltage output of a thermocouple located in pedestal 12, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat susceptor 18 the heater control subroutine 87 gradually controls a ramp up/down of current applied to the loop. Additionally, a built-in fail-safe mode can be included to detect process safety compliance, and can shut down operation of the heating unit if the process chamber 12 is not properly set up.

In some embodiments, chamber 12 is outfitted with an RF power supply 48 that is used for chamber cleaning or other operations. When a chamber cleaning plasma process is employed, plasma control subroutine 90 comprises program code for setting the frequency RF power levels applied to the process electrodes in the chamber 12. Similar to the previously described chamber component subroutines, the plasma control subroutine 90 is invoked by the chamber manager subroutine 77a.

The above CVD system description is mainly for illustrative purposes and should not be considered as limiting the scope of the present invention. Variations of the above described system, such as variations of platen or susceptor design, heater design, location of RF power connections and others are possible. The method for depositing a tungsten layer according to the present invention is not limited to any specific processing apparatus.

III. Depositing Tungsten Films

Figure 2:
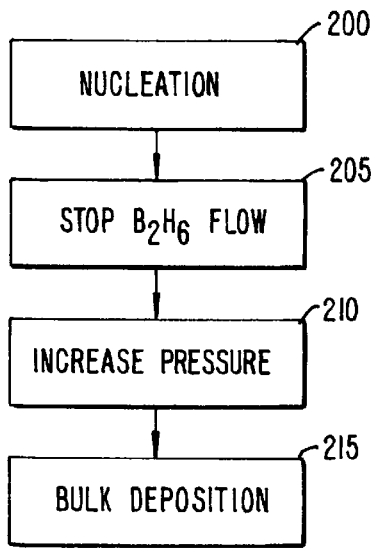
FIG. 2 is a flowchart illustrating the steps of a preferred embodiment of the present invention.

The method of the present invention may be employed to deposit improved tungsten films in a substrate processing chamber, such as the exemplary CVD chamber described above. FIG. 2 illustrates a preferred process of the invention that is used to deposit a tungsten film over a semiconductor substrate. The process is for exemplary purposes and is not intended to limit the scope of the claims of the present invention. Where applicable, reference numbers in the description below are used to refer to appropriate components of the exemplary chamber of FIGS. 1A–1D. This process is implemented and controlled using a computer program stored in the memory 46 of CVD system 10.

As shown in FIG. 2, the present invention includes a nucleation step 200 in which a process gas including a tungsten-containing source, a group III or V hydride, a silane gas, such as monosilane ($SiH_4$), and a carrier gas, such as argon (Ar) are flowed into chamber 12 for between about 10 to 60 seconds to grow a thin tungsten layer that acts as a growth site for subsequent tungsten film. In a preferred embodiment, the tungsten-containing source is $WF_6$ and the group III or V hydride is $B_2H_6$. Optionally, a reduction agent, such as $H_2$, and a nitrogen-containing source, such as $N_2$, may be added to the process gas. The heater temperature is set to between about 350 and 475° C. (corresponding to a wafer temperature of about 325–450° C.) while chamber pressure is set to between 1 and 50 torr.

After the completion of nucleation step 200, the flow of the tungsten-containing source and the flows of the hydride and the silane gases are stopped (step 205), and the pressure of the chamber is increased in preparation of bulk deposition step 215 (step 210). In step 205, once the tungsten-containing source, hydride and silane gas flows are stopped, the carrier gas flow is maintained for between about 5 to 40 seconds to purge the chamber of residual gases. If $N_2$ and $H_2$ gas flows are included in the process gas in step 200, these flows may also be maintained during this purge step. Chamber pressure is increased in step 210 in order to increase the deposition rate of tungsten in bulk deposition step 215. Preferably, the pressure is increased to between about 50 and 760 torr.

Finally, during bulk deposition step 215, the tungsten-containing source is reintroduced in the process gas and other process variables are maintained at conditions suitable to deposit a second layer of the tungsten film. If $H_2$ or a similar reduction agent was included in the process gas in steps 200–210, this flow should be continued in step 215. If $H_2$ or a similar reduction agent was not used in steps 200–210, such a flow is started in step 215. Maintaining or initiating a flow of a nitrogen-containing source is optional.

The length of bulk deposition step 215 depends on the thickness of the desired tungsten film. It is important to accurately control the amount of $B_2H_6$ introduced during nucleation step 200. Experiments have shown that resistance and resistivity initially decrease with the addition of $B_2H_6$ to the nucleation process gas, but then actually increase once the amount of $B_2H_6$ introduced reaches a saturation point. Preferably, the rate at which $B_2H_6$ is introduced into the chamber in this step is limited to between 1 and 50 sccm (expressed as an undiluted flow).

The inventors have found that tungsten films deposited according to the above method have a larger grain size than both tungsten films deposited without $B_2H_6$ and tungsten films deposited with $B_2H_6$ added in different manner, e.g., when $B_2H_6$ is added during the bulk deposition period. It is believed that the increased grain size results in a lower resistivity because there are fewer grain boundaries and reduced grain boundary scattering. It is believed that the presence of $B_2H_6$ at the surface of the substrate before the bulk deposition step and its evacuation before the pressure within the chamber is increased allows for formation of the larger grain size and reduces the amount of boron incorporated in the film. It is further believed that when boron is present in the chamber as the pressure is increased during the transition period between the nucleation and bulk deposition steps, boron is trapped in the film interface thus causing adhesion problems. Introducing and evacuating $B_2H_6$ in the manner taught by the present invention (i.e., before the pressure increase) provides improved adhesion as compared to a CVD tungsten $B_2H_6$ process that does not use the steps of the present invention.

Figure 3:
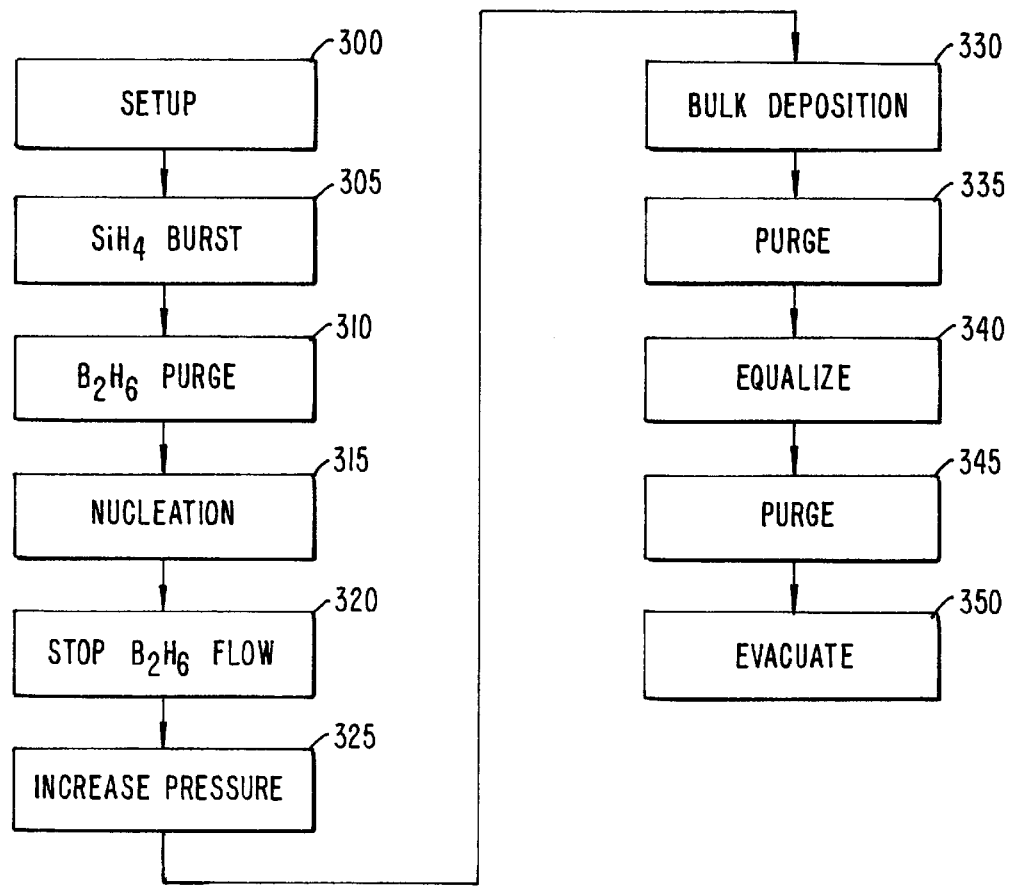
FIG. 3 is a flowchart illustrating the steps of a more preferred embodiment of the present invention.

In a preferred embodiment of the method of the present invention shown in FIG. 3, various setup, purge and other steps are performed in addition to the nucleation, purge, pressurization and bulk deposition steps described with respect to FIG. 2. As shown in FIG. 3, several steps including a setup step 300, a silane burst step 305 and a $B_2H_6$ presoak/purge step 310 are performed before a nucleation step 315. In set-up step 300, the wafer is first brought into the chamber, positioned 400 mil from the gas distribution manifold and heated to a temperature of 425° C. (about 8 seconds). Then Ar and $N_2$ are flowed into the chamber through manifold 14 at flow rates of 1000 sccm and 300 sccm, respectively, for 6 seconds and chamber pressure is set to 30 torr. A second flow of argon is flowed through the edge purge guide 54 at a rate of 1000 sccm. In step 305, $SiH_4$ and $H_2$ flows are added to the $Ar+N_2$ process gas for 15 seconds at rates of 300 and 1000 sccm, respectively, in order to incorporate silicon onto the substrate prior to introducing $WF_6$. This helps prevent $WF_6$ from attacking the silicon substrate by either etching the substrate surface or forming a silicide reaction.

Next, in step 310 the wafer is chucked to vacuum chuck 18 and the $SiH_4$ flow is stopped. A flow of $B_2H_6$ is also added to the argon, $H_2$ and $N_2$ flow to purge residual $SiH_4$ from the chamber and present $B_2H_6$ at the surface of the wafer. During this period, the flow of the Ar edge purge gas is increased to 2800 sccm. This $B_2H_6$ purge step lasts for 20 seconds and introduces $B_2H_6$ at a rate of 250 sccm. $B_2H_6$ is introduced as a solution of 5% $B_2H_6$ diluted with argon. Thus, the 250 sccm diluted $B_2H_6$ flow is equivalent to a 12.5 sccm undiluted $B_2H_6$ flow. After the wafer has been chucked and $SiH_4$ has been purged, a nucleation step 315 is initiated. Nucleation step 315 flows a process gas of $WF_6$, $B_2H_6$, $SiH_4$, $H_2$, $N_2$ and Ar into chamber 12 for 25 seconds to grow a thin tungsten layer as described above. In this embodiment, the flow rates of $WF_6$, $B_2H_6$, $SiH_4$, $H_2$, $N_2$ and Ar during nucleation step 315 are 30, 50, 15, 1000, 300 and 1500 sccm, respectively. The 50 sccm diluted $B_2H_6$ flow is equivalent to a 2.5 sccm undiluted $B_2H_6$ flow. Chamber temperature is set to 425° C. while chamber pressure is set to 30 torr.

After the completion of nucleation step 315, the flows of the $B_2H_6$, $WF_6$ and $SiH_4$ gases are stopped and the wafer is moved to a position 600 mil from manifold 14 (step 320) before the pressure of the chamber is increased to 90 torr (step 325). Step 320 maintains the $N_2$, $H_2$ and Ar flows for 8 seconds after the $B_2H_6$, $WF_6$ and $SiH_4$ flows are stopped, to purge the chamber of residual gases. Also, during purge step 320, the Ar carrier gas flow is increased to 2700 sccm and the Ar edge purge flow is increased to 3000 sccm. In step 325, the Ar flow through manifold 14 is decreased to 1500 sccm and the Ar edge purge is increased to 3200 sccm and combined with an $H_2$ edge purge flow of 800 sccm. The pressure increase to 90 torr is achieved during a 6 second period. Then, during bulk deposition step 330, the $WF_6$ flow is reintroduced with the process gas, the Ar carrier gas flow is reduced to 1000 sccm, the Ar edge purge is increased to 3600 sccm and process conditions are held for a predetermined period to complete deposition of the tungsten film.

In this embodiment, the rate at which $WF_6$ and $H_2$ are flowed into the chamber during bulk deposition step 330 depends on the application in which the resulting tungsten film will be used. If used in a via-fill application where conformality properties are favored over resistance, $WF_6$ is introduced at a rate of 95 sccm and $H_2$ flow is maintained at 700 sccm. If however, the tungsten film is used for an interconnect application, low resistivity is a primary concern and $WF_6$ flow is set to 36 sccm while $H_2$ flow is increased to 1800 sccm.

After bulk deposition step 330 is completed a purge step 335 is used to purge residual $WF_6$ deposition gases from chamber 12. In this purge step, the $WF_6$ and $H_2$ gas flows are stopped and the Ar carrier gas flow is increased to 2700 sccm for 6 seconds. Also, the lower Ar edge purge flow is decreased to 2800 sccm and the $H_2$ edge purge flow is stopped. Next, in step 340 an 1800 sccm flow of $H_2$ is introduced for 6 seconds, the wafer is dechucked (disengaged from vacuum clamping system 50) and the Ar edge purge flow is decreased to 500 sccm. In step 345, the throttle valve is fully opened while the chamber is purged for 3 seconds, and in step 350, all gas flows are stopped while the chamber is evacuated.

The interconnect film deposited according to the above process has a resistivity of 8.5 ohms-cm at a thickness of 600 Å while the via-fill film has a resistivity of 9.0 ohms-cm at a similar thickness. The fluorine concentration of each is about $1 \times 10^{18}$ atoms/cm$^3$ and the boron concentration is less than $1 \times 10^{16}$ atoms/cm$^3$ (the detection limit of the secondary ion mass spectroscopy equipment used in these tests).

Table 1 below shows the resistivity of several different tungsten films deposited according to the method of the present invention. Generally, the deposition conditions used to deposit the films shown in Table 1 are those described with respect to FIG. 3 above except that the deposition temperature was set to 445° C., the pressure during the nucleation stage was set to 4.5 torr and the flow rate of $B_2H_6$ in both steps 310 and 315 was varied along with the length of step 310 as indicated in Table 1. It is important to note that the $B_2H_6$ flow rates listed in Table 1 are based on undiluted values.

TABLE 1

$B_2H_6$ FLOW VS. RESISTIVITY

| Step 310 $B_2H_6$ Flow (sccm) | Step 310 Time (sec.) | Step 315 $B_2H_6$ Flow (sccm) | Resistivity ($\mu\Omega$-cm) |
|---|---|---|---|
| 5 | 20 | 0.5 | 10.3 |
| 10 | 20 | 0.5 | 9.5 |
| 20 | 20 | 0.5 | 9.4 |
| 5 | 20 | 2.5 | 10.2 |
| 10 | 20 | 2.5 | 9.1 |
| 20 | 20 | 2.5 | 8.8 |
| 5 | 20 | 3.5 | 10.9 |
| 10 | 20 | 3.5 | 9.2 |
| 20 | 20 | 3.5 | 9.6 |
| 10 | 20 | 2.5 | 9.5 |
| 20 | 20 | 2.5 | 8.9 |
| 20 | 30 | 2.5 | 8.6 |
| 20 | 40 | 2.5 | 8.8 |

As shown in Table 1, resistivity of tungsten films deposited according to the present invention varied between 8.6 and 10.9 $\mu\Omega$-cm. Not shown in Table 1 is that each of the deposited films exhibited good adhesion properties at the interface between the nucleation and bulk deposition steps. Strong adhesion at the interface was verified by SEM cross-sectional photographs. In experiments performed depositing tungsten films without the benefits of the present invention, the present inventors found that either resistivity of the films could be in the range exhibited by the films of the present invention or that the films could exhibit good adhesion properties at the nucleation/bulk deposition interface, but not both.

In one set of these experiments, the present inventors deposited a tungsten film according to a well known prior art process that did not include the addition of $B_2H_6$ to the process gas in either the nucleation or bulk deposition stages. Films deposited according to this process exhibited strong adhesion at the interface, but had a resistivity of no lower than 10.2 $\mu\Omega$-cm. In another set of these experiments, tungsten films were deposited by adding $B_2H_6$ to the bulk deposition stage. The resistivity of these tungsten films was relatively low (between about 9.0 and 11.0 $\mu\Omega$-cm), but SEM cross-sectional views of the films showed a distinct separation at the nucleation/bulk deposition interface.

The process parameters set forth above with respect to the preferred embodiments are optimized for one particular deposition process run in a resistively heated WxZ chamber manufactured by Applied Materials that is outfitted for 200 mm wafers. In addition to varying processing parameters described above to deposit tungsten layers according to specific applications, a person of ordinary skill in the art will recognize that these preferred parameters are in part chamber specific and will vary if chambers of other design and/or volume are employed.

The parameters listed in the above preferred processes and the above-described experiments should not be limiting to the claims as described herein. One of ordinary skill in the art can also use parameters and conditions other than those described with respect to the preferred embodiment. As such, the above description is illustrative and not restrictive. For example, other sources of nitrogen such as $N_2O$ can be used in the process gas, and other inert gases, such as helium can be used in place of argon. Also, other process temperature and pressure values and other gas flow rates can be employed. The scope of the invention should, therefore, be determined not with reference to the above description, but instead should be determined with reference to the appended claims along with their full scope of equivalents. other nitrogen sources;

What is claimed is:

1. A chemical vapor deposition process for depositing a tungsten film on a substrate, said method comprising:
   (a) placing a substrate in a deposition zone;
   (b) during a first deposition stage, depositing a first layer of said tungsten film by:
      (i) flowing a process gas comprising a tungsten-containing source, a group III or V hydride and an additional reduction agent into said deposition zone, and
      (ii) maintaining said deposition zone at or below a first pressure while maintaining other process variables at conditions suitable to deposit said first layer of the tungsten film;
   (c) during a second deposition stage after said first stage, depositing a second layer of the tungsten film on said first layer by:
      (i) stopping the flow of said group III or V hydride into said deposition zone, and thereafter
      (ii) increasing the pressure in said deposition zone to a second pressure above said first pressure while maintaining other process variables at conditions suitable to deposit said second layer of the tungsten film.

2. The chemical vapor deposition process set forth with respect to claim 1 wherein said second deposition stage further comprises:
   in step (c)(i), stopping the flow of said tungsten-containing source along with the flow of said group III or V hydride, and
   in step (c)(ii), after the pressure in said deposition zone is increased to said second pressure, reflowing said tungsten-containing source into said deposition zone while maintaining other process variables at conditions suitable for depositing the second layer of the tungsten film on the substrate.

3. The chemical vapor deposition process set forth with respect to claim 2 further comprising:
   (d) during a third deposition stage, prior to said first deposition stage, flowing a silicon-containing source into said chamber prior to flowing said tungsten-containing source into said chamber during said first deposition stage.

4. The chemical vapor deposition process set forth in claim 3 wherein a hydrogen reducing agent is also flowed into said chamber during said third deposition stage.

5. The chemical vapor deposition process set forth in claim 3 wherein said tungsten-containing source comprises $WF_6$, said group III or V hydride comprises $B_2H_6$ and said silicon-containing source comprises $SiH_4$.

6. The chemical vapor deposition process set forth in claim 5 wherein said additional reduction agent comprises $H_2$.

7. The chemical vapor deposition process set forth in claim 2 wherein said process gas introduced during said first and second deposition stages further comprises a nitrogen-containing source.

8. The chemical vapor deposition process set forth in claim 2 wherein said process gas introduced during said first deposition stage further comprises a silicon-containing source and wherein the flow of said silicon-containing source is stopped along with the stoppage of said group III or V halide in step (c)(i).

9. The method of claim 1 wherein said first pressure is between 1 and 50 Torr and said second pressure is between 50 and 760 Torr.

10. The method of claim 1 wherein said first layer of said tungsten film is deposited on a layer of titanium nitride.

11. A chemical vapor deposition process for depositing a tungsten film on a substrate, said method comprising:
   (a) placing a substrate in a deposition zone;
   (b) during a first deposition stage, depositing a first layer of said tungsten film by:
      (i) flowing a process gas comprising a tungsten-containing source, diborane, a silane gas, a reduction agent and a carrier gas into the deposition zone, and
      (ii) maintaining the deposition zone at a first pressure level below 50 torr and at process conditions suitable to deposit said first layer of the tungsten film on the substrate; and
   (c) during a second deposition stage after said first deposition stage, depositing a second layer of said tungsten film on said first layer by:
      (i) stopping the flows of said tungsten-containing source, said diborane and said silane gas,
      (ii) thereafter, increasing the pressure in the deposition zone to a second pressure level of at least 50 torr, said second pressure level being greater than said first pressure level, and
      (iii) between about 5 and 20 seconds after stopping the flows of said gases in step (c)(i), restarting the flow of said tungsten-containing source to deposit said second layer of the tungsten film.

12. The method of claim 11 further comprising a third deposition stage, prior to said first deposition stage, in which a process gas comprising a silane gas, a reduction agent and a carrier gas is flowed into the deposition zone.

13. The method of claim 11 wherein said tungsten-containing source comprises $WF_6$, said silane gas comprises $SiH_4$ and said reduction agent comprises $H_2$.

14. The method of claim 13 wherein said carrier gas comprises argon.

15. The method of claim 13 wherein a nitrogen-containing gas flow is added to said process gas in said first deposition stage and maintained throughout said second deposition stage.

16. The method of claim 11 wherein said diborane gas is diluted in argon at a volume ratio of about 5% diborane:argon or less.

17. The method of claim 11 wherein said first layer of said tungsten film is deposited on a layer of titanium nitride.

18. A chemical vapor deposition process for depositing a tungsten film on a substrate, said method comprising:

placing a substrate in a deposition zone;

prior to a first deposition stage flowing a purge gas including a group III or V hydride and an inert gas into said deposition zone;

during the first deposition stage, depositing a first layer of said tungsten film by flowing a first process gas comprising a tungsten-containing source, a group III or V hydride, and a first reduction agent into said deposition zone, and maintaining said deposition zone at or below a first pressure while maintaining other process variables at conditions suitable to deposit said first layer of the tungsten film;

during a second deposition stage after said first stage, depositing a second layer of the tungsten film on said first layer by flowing a second process gas comprising a tungsten-containing source and a second reduction agent into said deposition zone while maintaining said deposition zone at a pressure above said first pressure and maintaining other process variables at conditions suitable to deposit said second layer of the tungsten film.

19. The chemical vapor deposition process of claim 18 further comprising, prior to flowing said purge gas, flowing a silicon-containing source into the deposition zone and stopping the flow of said silicon-containing source prior to flowing said group III or V hydride and inert gas purge gas.

20. The chemical vapor deposition process of claim 19 wherein said silicon-containing source is flowed for between about 10 and 30 seconds and wherein said purge gas is flowed for between about 10–40 seconds.

21. The method of claim 18 wherein said first reduction agent comprises $SiH_4$ and said second reduction agent comprises $H_2$.

22. The method of claim 21 wherein said group III or V hydride in said first process gas is diborane.

23. The method of claim 18 wherein said group III or V hydride in said purge gas is $B_2H_6$.

24. A process for depositing a tungsten film over a substrate disposed in a substrate processing chamber, said process comprising:

depositing, at a first pressure level, a first layer of said tungsten film from a first process gas comprising a tungsten-containing source and a group III or V hydride reducing agent; and depositing, at a second pressure level, a second layer of said tungsten film on said first layer from a second process gas comprising a tungsten-containing source and a first reduction agent, wherein said second pressure level is greater than said first pressure level and said second process gas does not include a group III or V hydride.

25. The method of claim 24 wherein said first pressure is between 1 and 50 Torr and said second pressure is between 50 and 760 Torr.

26. The process of claim 25 wherein said group III or V hydride is diborane.

27. The process of claim 26 wherein said first process gas further comprises a second reducing agent and an inert gas and said second process gas further comprises an inert gas.

28. The process of claim 27 wherein said first and second reducing agents are $H_2$.

29. The process of claim 28 wherein said first process gas further comprises silane.

30. The process of claim 29 wherein said first layer of said tungsten film is deposited on a layer of titanium nitride.

31. The process of claim 24 wherein said chamber is purged between deposition of said first and second tungsten layers with a purge gas flow.

32. The process of claim 31 wherein the pressure within said chamber is increased to said second pressure level after said chamber is purged with said purge gas.

33. The process of claim 32 wherein said first layer of said tungsten film is deposited on a layer of titanium nitride.

* * * * *